United States Patent [19]

Liu et al.

[11] Patent Number: 4,914,500

[45] Date of Patent: Apr. 3, 1990

[54] METHOD FOR FABRICATING SEMICONDUCTOR DEVICES WHICH INCLUDE SOURCES AND DRAINS HAVING METAL-CONTAINING MATERIAL REGIONS, AND THE RESULTING DEVICES

[75] Inventors: Ruichen Liu, Warren; William T. Lynch, Summit; David S. Williams, Convent Station, all of N.J.

[73] Assignee: AT&T Bell Laboratories, Murray Hill, N.J.

[21] Appl. No.: 128,742

[22] Filed: Dec. 4, 1987

[51] Int. Cl.$^4$ .................. H01L 23/54; H01L 21/441; H01L 21/461
[52] U.S. Cl. ........................................ 357/67; 357/23.3
[58] Field of Search ............................ 357/67, 23.3, 55

[56] References Cited

U.S. PATENT DOCUMENTS

| | | | |
|---|---|---|---|
| 4,689,869 | 9/1987 | Jambotkar et al. | 357/23.3 |
| 4,697,198 | 9/1987 | Komori et al. | 357/23.3 |
| 4,769,686 | 9/1988 | Horiuchi et al. | 357/67 |

Primary Examiner—Rolf Hille
Assistant Examiner—S. V. Clark
Attorney, Agent, or Firm—Bernard Tiegerman

[57] ABSTRACT

A new method for fabricating a semiconductor device, e.g., a MOS or MES IC, as well as the resulting device, are disclosed. In accordance with the new method, a semiconductor device is formed, at least in part, by forming a material region which includes metal, e.g., elemental metal or a metal-containing compound, on a semiconductor substrate. One or more dopants are implanted into the material region, and the substrate is heated in order to diffuse the dopants out of the material region and into the substrate, thus forming a dopant-diffused substrate region, e.g., a source or drain. Significantly, the new method involves implant conditions which yield a material region-to-substrate specific contact resistance equal to or less than about $10^{-6} \Omega-cm^2$. In addition, the new method involves heating temperatures and heating times which yield a dopant-diffused substrate region having a depth, relative to the top of the material region, equal to or less than about 0.2 micrometers.

5 Claims, 6 Drawing Sheets

METHOD FOR FABRICATING SEMICONDUCTOR DEVICES WHICH INCLUDE SOURCES AND DRAINS HAVING METAL-CONTAINING MATERIAL REGIONS, AND THE RESULTING DEVICES

BACKGROUND OF THE INVENTION

1. Field of the Invention

The invention pertains generally to methods for fabricating semiconductor devices, e.g., semiconductor integrated circuit (IC) devices, as well as the resulting devices.

2. Art Background

Semiconductor ICs are devices which include a plurality of electrically interconnected discrete devices formed in and on a semiconductor substrate. Included among these ICs are MOS (metal-oxide-semiconductor) and MES (metal-semiconductor) ICs. The MOS ICs typically include a plurality of MOSFETs (MOS field effect transistors), each of which includes an active surface layer of semiconductor material, e.g., silicon. Each MOSFET also includes a relatively thin gate oxide (GOX) formed on the surface of the active layer, a gate electrode of, for example, polycrystalline silicon (polysilicon), formed on the surface of the GOX, and two relatively heavily doped portions of the active layer, on opposite sides of the gate electrode, which constitute the source and drain of the MOSFET. A relatively thick (compared to the GOX) field oxide (FOX) serves to separate and electrically insulate the MOSFETs from one another. Similarly, the MES ICs typically include a plurality of MESFETs (MES field effect transistors), with the MESFETs differing from MOSFETs only in that the MESFET gate electrodes are of metal or of a metal-containing compound, e.g., a metal silicide, and directly contact the semiconductor material.

At present, in commercially available ICs, the length of the gate electrode, and thus the length of the current channel, is typically about 2 micrometers ($\mu$m), while the depth of both the source and drain is typically about 0.5 $\mu$m. However, to achieve ICs having increased packing densities (of discrete devices), it is expected that gate electrode lengths (and thus current channel lengths) will be reduced to values equal to or less than about 1 $\mu$m. Concomitantly, to avoid certain undesirable effects, usually termed short-channel effects, it is also expected that the depths of the sources and/or drains will be reduced to values equal to or less than about 0.2 $\mu$m. (The undesirable short-channel effects, referred to here, are unwanted threshold voltage shifts and source-to-drain subthreshold leakage currents which occur when the ratio of channel length to source/drain depth is relatively small, e.g., equal to or less than about 2.5. Regarding short-channel effects see, e.g., J. R. Brews et al, "Generalized guide for MOSFET miniaturization," IEEE Elect. Dev. Lett., Vol. EDL-1(1), p. 2, (1980).)

Significantly, relatively shallow sources and drains, i.e., sources and drains having depths equal to or less than about 0.2 $\mu$m, exhibit undesirably large resistances, which adversely affect device performance. To achieve relatively low source/drain resistance while employing relatively shallow sources and drains, it has been proposed that each relatively shallow source and drain be formed to include an overlying region of metal silicide, e.g., molybdenum silicide ($MoSi_2$), tungsten silicide ($WSi_2$), or titanium silicide ($TiSi_2$), the purpose of which is to serve as a low-resistance current shunt. In this regard, the effective (electrical) depth of a metal silicide-covered source or drain, i.e., the depth involved in source-drain-gate interactions, is the combined depth of the metal silicide region and the underlying (heavily doped) source or drain as measured relative to, and extending beneath, the surface of the active layer.

Previous attempts to fabricate ICs containing metal silicide-covered sources and drains have involved the use of conventional procedures for forming sources and drains, i.e., have involved implanting and diffusing source/drain dopant into those regions of a silicon substrate where the sources and drains are desired, followed by deposition of a metal, such as Mo, W and Ti, onto the surfaces of the underlying sources and drains. The deposited metal was then reacted with the underlying silicon of the sources and drains (thus consuming some of the silicon) to form the corresponding metal silicide. This technique has proven effective in those cases where the sources and drains initially (prior to the formation of the metal silicide) extended relatively deeply into the silicon, i.e., extended more than about 0.25 $\mu$m into the silicon. However, this technique has proven undesirable in those cases where the sources and drains initially extended only a relatively small distance into the silicon, i.e., extended by a distance equal to or less than about 0.25 $\mu$m, because, among other reasons, an undesirably large amount of source/drain silicon was consumed in forming the metal silicide, resulting in metal silicide spikes extending through, and thus short-circuiting, the source/drain p-n junctions.

A different technique for forming metal silicide-covered sources and drains is described by H. Okabayashi et al in "A New Low Resistance Shallow Junction Formation Method Using Lateral Diffusion Through Silicide," IEDM Technical Digest, pp. 670–673 (1983). In accordance with this technique, such a source or drain is formed by initially fabricating a region of molybdenum silicide ($MoSi_2$) having a thickness of, for example, 0.1 $\mu$m, on the surface of a silicon substrate. This is achieved by depositing molybdenum onto the silicon substrate and reacting the molybdenum with the underlying silicon. Then, source/drain dopant is diffused into the molybdenum silicide, from which it is diffused into the underlying silicon to form the source/drain p-n junction. That is, the molybdenum silicide-covered silicon substrate is contacted by a gaseous or solid dopant source while heated to a sufficiently high temperature and for a sufficiently long time period, e.g., 1000 degrees Centigrade (C) and 20 minutes, to effect dopant diffusion into the molybdenum silicide and then into the underlying silicon, in one step. Alternatively, the dopant is diffused into the silicon in a two-step process, the first step being to diffuse the dopant from the gaseous or solid dopant source into the molybdenum silicide (but not into silicon) by initially heating the molybdenum silicide-covered silicon substrate to a relatively low temperature, e.g., 800 degrees C. Subsequently, dopant is diffused out of the molybdenum silicide and into the silicon by heating the substrate to a substantially higher temperature, e.g., 950 or 1000 degrees C. Significantly, the one-step diffusion process yields relatively deep sources and drains, e.g., if the molybdenum silicide is 0.1 $\mu$m thick, then the source or drain extends about 1.5 $\mu$m below the upper surface of the silicide. While the two-step diffusion process yields shallower sources and drains, they are also relatively deep, e.g., if the molybdenum silicide is 0.1 μm thick, then the source or drain extends about 0.36 μm below the upper surface of the silicide.

In yet another technique previously used to form metal silicide-covered sources and drains, a region of tungsten silicide (WSi$_2$) is initially formed on a silicon substrate, and dopant is implanted (rather than diffused) into the tungsten silicide. (See F. C. Shone et al, "Formation of 0.1 μm N+/P and P+/N Junctions by Doped Silicide Technology," IEDM Technical Digest, pp. 407-410 (1985).) Then, the implanted dopant is diffused out of the tungsten silicide and into the silicon substrate by heating the substrate, using either conventional furnace annealing techniques or rapid thermal annealing (RTA) techniques. (Regarding RTA see, e.g., T. O. Sedgwick, "Short Time Annealing", *Journal of the Electrochemical Society*, Vol. 130, p. 484 (1983).) Significantly (as taught in F. C. Shone et al, supra), the thickness of the tungsten silicide region is 0.2 μm, and the corresponding implant doses, heating temperatures and heating times are all (presumably) specifically tailored to this particular thickness of tungsten silicide. As a result, this particular technique only yields sources and drains having depths (as measured from the upper surface of the tungsten silicide) equal to or greater than 0.3 μm.

A variant of the above technique is described by N. Kobayashi et al in "Comparison of TiSi$_2$ and WSi$_2$ Silicided Shallow Junctions For Sub-Micron CMOSs," Digest of papers, 1986 Symposium on VLSI Technology, San Diego (1986). Here, a 0.1 μm-thick region of either tungsten silicide or titanium silicide is initially formed on a silicon substrate, source/drain dopant is implanted into the silicide and then diffused out of the silicide and into the silicon. However, in the case of tungsten silicide, and as shown in FIG. 1 of the N. Kobayashi et al journal article, the authors of the article teach implant doses, heating temperatures and heating times which yield sources and drains having depths (as measured from the upper surface of the tungsten silicide) significantly greater than 0.2 μm, e.g., depths of 0.26 μm and 0.28 μm. By contrast, in the case of titanium silicide, and as shown in FIG. 1, the authors do teach an arsenic implant dose, heating temperature and heating time which yields a source or drain having a depth (as measured from the surface of the titanium silicide) which is less than 0.2 μm, i.e., about 0.16 μm. But, as is also evident from FIG. 1, the concentration of arsenic at the titanium silicide/silicon interface is relatively low. This is highly significant because (contrary to the assertions made by the authors of the journal article) this relatively low interface concentration leads to an undesirably high specific contact resistance ($R_c$), i.e., an $R_c$ substantially higher than $10^{-6}\Omega\text{-cm}^2$. In fact, in the journal article, the authors indicate the desirability of implanting additional arsenic into the silicon (not into the titanium silicide) in order to increase interface arsenic concentration (presumably for the purpose of lowering $R_c$). Unfortunately, as is known, such a procedure is undesirable because the silicon substrate must then be heated to a relatively high temperature to anneal out the resulting implant damage in the silicon, which produces additional dopant diffusion and, as a consequence, relatively deep sources and drains.

Thus, those engaged in the development of IC fabrication methods have sought, thus far without success, methods for fabricating ICs having metal silicide-containing, relatively shallow sources and drains exhibiting $R_c$ s equal to or less than about $10^{-6}\Omega\text{-cm}^2$.

SUMMARY OF THE INVENTION

The invention involves a new technique for forming a source or drain covered by a metal-containing material region, i.e., a region containing either an elemental metal or a metal-containing compound, such as a metal silicide. Significantly, this new technique yields a material region-covered source or drain having a depth (relative to the upper surface of the material region) equal to or less than about 0.2 μm, and exhibiting an $R_C$ equal to or less than about $10^{-6}\Omega\text{-cm}^2$.

In accordance with the inventive technique, a metal-containing material region having an average thickness, t, less than about 0.2 μm, is initially formed on the surface of a semiconductor substrate. Then, one or more dopants are implanted into the region, and the semiconductor substrate is heated to diffuse these dopants out of the region and into the substrate. Significantly, to produce an $R_C$ equal to or less than about $10^{-6}\Omega\text{-cm}^2$, the heating procedure must yield a concentration of at least one of the dopants in the substrate, immediately adjacent to the material region/substrate interface, which is equal to or greater than a minimum value, determined by the height of the Schottky potential barrier at the interface prior to substrate heating. To achieve this minimum value, it has been found that three conditions must be satisfied. The first condition is that the solid solubility of at least one of the dopants in the substrate at the temperature or temperatures employed during the heating procedure must be equal to or greater than the above minimum value. The second condition is that, for this same dopant, the ratio of the corresponding implant dose, I, to the average thickness of the material region, t, must be equal to or greater than about one-half the solid solubility (elaborated upon below) of this dopant in the material region at the heating temperature or temperatures. (In this regard, it has been determined, for example, that the arsenic implant dose employed in N. Kobayashi et al, supra, does not satisfy this second, critical requirement.) The third condition, which must be satisfied both to achieve the desired interface concentration and to achieve a useful source/drain junction, is that, for this same dopant, the total number of dopant ions implanted into the material region should be substantially larger than the number needed to form the underlying, diffused source or drain. If the necessary minimum value of the dopant concentration in the substrate, immediately adjacent to the material region/substrate interface, is denoted by $C_o$, and if the desired depth of the source/drain junction relative to the bottom of the material region is denoted by x, then the third condition is automatically satisfied provided $I \geq 5 \cdot C_o \cdot x/2$. In most instances, implant doses which satisfy the second condition also automatically satisfy the third condition. However, in the event the implant dose satisfies the second condition but is less than $5C_o \cdot x/2$, then the third condition will certainly be satisfied by increasing this implant dose by an amount equal to or greater than $C_o \cdot x/2$.

The inventive technique further involves a procedure (described below) for choosing the heating temperature-time profile needed to produce a source or drain having the desired depth.

BRIEF DESCRIPTION OF THE DRAWINGS

The invention is described with reference to the accompanying drawings, wherein.

DETAILED DESCRIPTION

Figure 1:
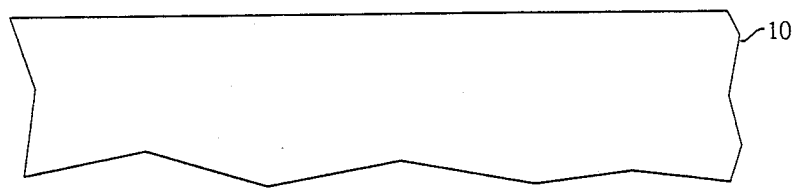
FIGS. 1-8 depict the steps involved in a first embodiment of the inventive device fabrication method.
Figure 2:
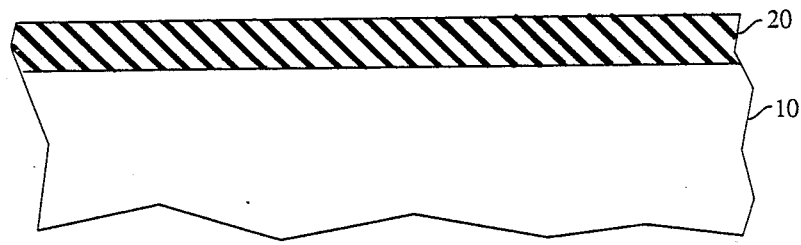
Figure 3:
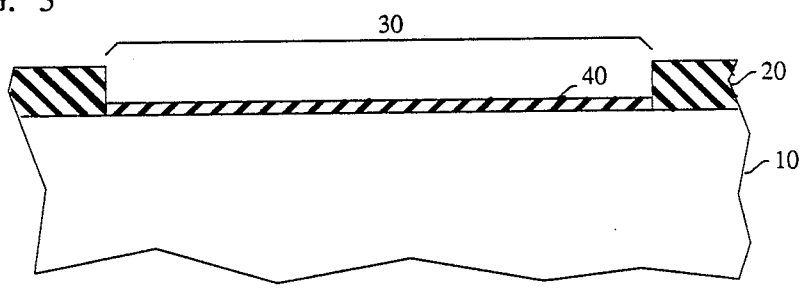

The invention encompasses both a method for fabricating a semiconductor device, such as a MOS or MES semiconductor IC, as well as the resulting device. Significantly, the device produced in accordance with the inventive method includes at least one source or drain covered by a metal-containing material region, e.g., a region containing elemental metal, such as tungsten (W). Alternatively, the metal-containing material region includes a metal-containing compound, such as a metal silicide, e.g., cobalt silicide ($CoSi_2$), titanium silicide ($TiSi_2$), tungsten silicide ($WSi_2$), molybdenum silicide ($MoSi_2$), tantalum silicide ($TaSi_2$) or platinum silicide (PtSi). In addition, the depth of the material region-covered source or drain, relative to the upper surface of the material region, is equal to or less than about 0.2 μm. (The depth of a material region-covered source or drain, for purposes of the invention, is the length of a perpendicular extending from a least-squares-fit planar approximation to the upper surface of the material region to the lowest point of the interface between the source or drain and the semiconductor substrate in which the source or drain is formed. If the source or drain is, for example, of n-type conductivity, then the interface is just the locus of points where the concentration of n-type dopant in the source or drain is equal to the concentration of p-type dopant in the substrate, and vice versa. Such an interface is readily located using conventional techniques, such as secondary ion mass spectroscopy (SIMS).) Further, the specific contact resistance, $R_C$, of the material region to the underlying (diffused) source or drain is equal to or less than about $10^{-6}\Omega\text{-cm}^2$. ($R_C$ is readily measured using the conventional procedure described in K. K. Ng, "A novel technique to measure the contact resistance of a MOSFET", IEEE-Electron Devices, Vol. 34, p. 544 (1987).)

In accordance with the inventive method, the material region-covered source or drain is formed by initially forming the material region on a substrate which includes semiconductor material, e.g., silicon or gallium arsenide. Such a material region is formed, for example, by depositing the material constituting the region onto the substrate using conventional techniques, e.g., conventional sputtering techniques. Alternatively, if the material region includes, for example, a metal silicide, and if the substrate is of silicon, then the material region is readily formed, at least in part, by depositing the corresponding elemental metal onto the silicon substrate, and reacting the deposited metal with the underlying silicon to form the metal silicide. To achieve a material region-covered source or drain having a depth (as defined above) equal to or less than about 0.2 μm, then the maximum thickness, and consequently the average thickness, t, of the material region (which, in general, is of non-uniform thickness) should be less than 0.2 μm. In addition, the minimum thickness of the (non-uniformly thick) material region is preferably equal to or greater than about 0.01 μm. Minimum thicknesses less than about 0.01 μm are less desirable because, among other reasons, the corresponding portion of the material region will often contain an undesirably large number of pinholes which, during implantation, permit an undesirably large amount of dopant to be implanted into the substrate rather than into the material region.

After forming the material region, one or more different dopants is implanted into the material region, and the substrate is subsequently heated to diffuse the implanted dopants out of the material region and into the substrate to form the desired source or drain. If the substrate semiconductor material is of p-type conductivity, then the implanted dopant or dopants should constitute electron donors in the substrate, and if the substrate semiconductor material is of n-type conductivity, then the dopants should constitute electron acceptors. In the case of, for example, silicon, useful donor ions include phosphorus (P) and arsenic (As) ions, while useful acceptor ions include boron (B) ions.

As discussed above, to achieve an $R_C$ equal to or less than about $10^{-6}\Omega\text{-cm}^2$, the substrate heating procedure must yield a concentration of at least one of the dopants in the substrate, immediately adjacent to the material region/substrate interface, which is equal to or greater than a minimum value determined by the height of the Schottky potential barrier at the material region/substrate interface prior to substrate heating. That is, knowing this potential barrier height implies the corresponding minimum value. In this regard, the Schottky potential barrier height at the interface between almost any metal-containing material and almost any semiconductor material is readily available in the literature, as is the corresponding minimum value of interface dopant concentration needed to produce the desired $R_C$. For example, the Schottky potential barrier height at the interface between any of a wide variety of elemental metals and, for example, n-type or p-type silicon is to be found in S. M. Sze, *Physics of Semiconductor Devices*, 2nd Edition (John Wiley and Sons, NY, 1981), p. 292. Similarly, the Schottky potential barrier height at the interface between any of a wide variety of metal silicides and n-type or p-type silicon is to be found in S. P. Murarka, *Silicides for VLSI Applications* (Academic Press, N.Y., 1983), p. 15. Further, the minimum interface dopant concentration needed to produce an $R_C$ equal to or less than about $10^{-6}\Omega\text{-cm}^2$, corresponding to almost any Schottky potential barrier height, is to be found in S. M. Sze, supra, at pp. 304-305. By way of illustration, if the material region includes, for example, cobalt silicide ($CoSi_2$), if the substrate includes p-type silicon and if one of the implanted, n-type dopants is arsenic (As), then, according to S. P. Murarka, supra, the corresponding Schottky potential barrier height is 0.64 volts (V) and, according to S. M. Sze, supra, at pp. 304-305, the corresponding minimum interface concentration of arsenic is about $1 \times 10^{20} \text{cm}^{-3}$. Similarly, if the material region includes titanium silicide ($TiSi_2$), if the substrate includes n-type silicon and if one of the implanted, p-type dopants is boron (B), then, according to S. P. Murarka, supra, the corresponding Schottky potential barrier height is 0.5 V and, according to S. M. Sze, supra, at pp. 304-305, the corresponding minimum interface concentration of boron is about $3 \times 10^{19} \text{cm}^{-3}$.

As also discussed, to achieve the dopant concentration in the substrate, immediately adjacent to the material region/substrate interface, needed to produce an $R_C$ equal to or less than about $10^{-6}\Omega\text{-cm}^2$, it has been found that three conditions must be satisfied. The first condition is that the solid solubility in the substrate of at least one of the dopants, at the temperature or temperatures employed during the substrate heating procedure, must be equal to or greater than the minimum interface concentration, discussed above. Significantly, the solid solubilities of dopants in semiconductors are generally very sensitive to, and increase with, temperature. As a consequence, this first condition, in effect, imposes a minimum value, $T_{min}$, on the temperatures which may be employed during the substrate heating procedure. That is, the heating temperatures must be equal to or greater than $T_{min}$ to ensure that the solid solubility in the substrate of at least one of the dopants will be at least equal to the minimum dopant concentration in the substrate, immediately adjacent to the material region/substrate interface, needed to achieve the desired $R_C$. In this regard, the solid solubilities of a wide variety of dopants in a wide variety of semiconductor materials, as a function of temperature, is available in the literature. (See, e.g., J. C. C. Tsai in *VLSI Technology*, edited by S. M. Sze (McGraw-Hill, N.Y., 1983), pp. 198–199.) Consequently, the $T_{min}$ needed to satisfy the first condition is readily determined. For example, the solid solubility of arsenic in silicon at 740 degrees C., 800 degrees C. and 900 degrees C. is, respectively, $1 \times 10^{20} cm^{-3}$, $1.5 \times 10^{20} cm^{-3}$ and $2 \times 10^{20} cm^{-3}$. (See J. C. C. Tsai, supra.) If arsenic is employed as an n-type dopant in p-type silicon and if the material region is of $CoSi_2$, then (as discussed above) the minimum interface concentration needed to achieve the desired $R_C$ is $1 \times 10^{20} cm^{-3}$, and consequently $T_{min}$ is 740 degrees C. Similarly, the solid solubility of boron in silicon at 800 degrees C. and at 900 degrees C. is, respectively, $3 \times 10^{19} cm^{-3}$ and $6 \times 10^{19} cm^{-3}$. If boron is employed as a p-type dopant in n-type silicon and if the material region is of $TiSi_2$, then (as also discussed above) the minimum interface concentration needed to achieve the desired $R_C$ is $3 \times 10^{19} cm^{-3}$, and consequently $T_{min}$ is 800 degrees C.

The second condition which must be satisfied is that for the at least one dopant, referred to above, the ratio of the corresponding implant dose, I, to the average thickness of the material region, t, i.e., I/t, must be equal to or greater than about one-half, and preferably greater than, the solid solubility of this dopant in the material region at the temperature or temperatures (necessarily equal to or greater than the corresponding $T_{min}$) employed during substrate heating. The solid solubility, discussed here, refers to the saturation level of the at least one dopant in the material region, including the interface between the material region and the substrate, at the temperature or temperatures employed during the substrate heating procedure. Significantly, this saturation level is sensitive to, i.e., generally increases with, temperature. In addition, this saturation level depends on the composition of the material region and on the degree of crystallinity of the material region (i.e., in the case of, for example, a polycrystalline material, dopant is often distributed both within the grains and within the grain boundaries). Further, the saturation level depends on the nature of the material region/substrate interface, i.e., on whether dopant becomes relatively highly concentrated at this interface.

In general, the solid solubility of the dopant in the material region (including the material region/substrate interface), at the temperature or temperatures employed during substrate heating, is determined empirically. That is, in accordance with the invention, a control sample of the material region, having the same average thickness, t, as the material region employed in the device, is formed (using the same technique employed in the fabrication of the device) on a semiconductor substrate (having the identical composition and structure as the substrate employed in the device). (Significantly, as explained more fully below, the area, A, of the upper surface of the control sample need not be the same as that of the material region.) The substrate bearing the control sample is placed in an evacuated furnace, i.e., a furnace where the ambient pressure has been lowered to a value of, for example, $10^{-6}$ torr. Then, a gas containing the dopant of interest is flowed into the furnace. For example, if the dopant is phosphorus, then a useful phosphorus-containing gas is $PH_3$. Similarly, if the dopant is arsenic, then a useful arsenic-containing gas is $AsH_3$, while if the dopant is boron, then a useful boron-containing gas is $B_2H_6$. (It should be noted that $PH_3$, $AsH_3$ and $B_2H_6$ are highly toxic gases, and appropriate safety precautions must be used.) In this regard, the flow rate of the dopant-containing gas should be sufficiently high so that the partial pressure of this gas is at least one hundred times that of the ambient, e.g., if ambient gas pressure is $10^{-6}$ torr, then the partial pressure of the dopant-containing gas should be at least $10^{-4}$ torr. This requirement is to ensure that the control sample is saturated (during the next step) essentially only with dopant, rather than with contaminants in the ambient. While flowing the dopant-containing gas into the furnace, the furnace is then heated to the temperature of interest, i.e., the temperature to be used during substrate heating. To achieve dopant saturation within the control sample, this temperature should be maintained for at least 1 minute, and preferably for at least 30 minutes.

After being subjected to the dopant-containing gas, the control sample is removed from the furnace, and the total number of dopant atoms, N, within the control sample, including the control sample/substrate interface, is measured using, for example, the conventional SIMS technique. The solid solubility of the dopant in the material region is just N/At. (It should be noted that the total number of atoms, N, is linearly proportional to surface area, A. As a result, control samples having identical average thicknesses, t, but different surface areas yield identical values of the solid solubility.) Consequently, to satisfy the second condition, I must be chosen so that $I/t \geq 0.5 N/At$.

Using the above empirical procedure, it has been found, for example, that if the material region consists of cobalt silicide, has an average thickness of 0.07 $\mu m$ and overlies a silicon substrate, and if the dopant is arsenic, then an implant dose of $5 \times 10^{15} cm^{-2}$ more than satisfies the second condition at a temperature of 800 degrees C. Similarly, if the material region consists of titanium silicide, has an average thickness of 0.08 $\mu m$ and overlies a silicon substrate, and if the dopant is boron, then an implant dose of $1 \times 10^{16} cm^{-2}$ more than satisfies the second condition at a temperature of 800 degrees C.

The third condition which must be satisfied, both to achieve the desired $R_C$ and to achieve a useful source/drain junction (i.e., a junction where the ratio of forward to reverse current at, for example, a voltage of 0.5 volts and a temperature of 25 degrees C., is equal to or greater than $10^6$) is that, for the at least one dopant, the total number of dopant ions implanted into the material region should be substantially larger than the number needed to form the underlying, diffused source or drain. If the minimum value of the dopant concentration in the substrate, immediately adjacent to the material region/substrate interface, is denoted by $C_o$, and if the desired depth of the source/drain p-n junction relative to the bottom of the material region is denoted by x, then the third condition is automatically satisfied provided $I \geq 5 \cdot C_o \cdot x/2$. In most instances, implant doses which satisfy the second condition also automatically satisfy the third condition. However, if the implant dose satisfies the second condition but is less than $5 C_o \cdot x/2$, then the third condition will certainly be satisfied by increasing this implant dose by an amount equal to or greater than $C_o x/2$. In this regard, the two implant doses, given above, also satisfy the third condition.

It must be noted that the energies of the ions implanted into the metal-containing material regions are chosen so that essentially all the ions, i.e., at least 90 percent of the ions, are implanted into these regions, and not into the underlying semiconductor substrates. In this regard, it should also be noted that silicon is less dense than the metal-containing material regions employed in the present invention, and thus identical ions, having identical energies, penetrate to greater depths into silicon than into the material regions. Consequently, to ensure that essentially all the ions are implanted into the material regions, the ion energies are chosen to produce corresponding penetration depths into silicon which are equal to or less than the thicknesses of the material regions. (Ion penetration depths into silicon, as a function of ion energies, are to be found in R. A. Colclaser, *Microelectronics Processing and Device Design* (Wiley and Sons, N.Y., 1980), pp. 150-153.) By way of example, when implanting arsenic ions into a region of cobalt silicide having an average thickness of 0.07 μm, using implantation energies equal to or less than 60 keV (the arsenic ion energy which results in 90 percent of the arsenic ions penetrating silicon to a depth equal to or less than 0.07 μm) ensures that essentially all the arsenic ions are implanted into the cobalt silicide. Similarly, when implanting boron ions into a region of titanium silicide having an average thickness of 0.08 μm, using implantation energies equal to or less than 10 keV (the boron ion energy which results in 90 percent of the boron ions penetrating silicon to a depth equal to or less than 0.08 μm) ensures that essentially all the boron ions are implanted into the titanium silicide.

The invention further involves an iterative technique for choosing the temperature-time profile to be used during substrate heating, to achieve the desired source/drain depth. Here, it is assumed that the average thickness, t, of the material region is known or is specified, as is the doping level, $N_A$, of the substrate. It is also assumed that the above three conditions have been satisfied, and that as a result of substrate heating, the concentration of dopant in the substrate, immediately adjacent to the material region/substrate interface, will be equal to or greater than $C_o$, the (known) minimum value needed to achieve the desired $R_C$. Initially, for the sake of simplicity, it is further assumed that only one temperature, T, which is necessarily equal to or greater than $T_{min}$, will be employed during the heating procedure. If the variable x' is used to denote the vertical position of a point within the (diffused) source or drain relative to the bottom of the material region, if $\tau$ denotes time, if $D(=D(T))$ denotes the diffusion coefficient of the dopant in the substrate, if $C(=C(x',\tau))$ denotes dopant concentration in the source or drain, and if $C_o'$ denotes the desired dopant concentration immediately adjacent to the material region/substrate interface which yields an $R_C$ equal to or less than about $10^{-6} \Omega \text{-cm}^2$, then it has been determined that C is well approximated by the formula $$C(x',\tau) = C_o' \cdot \text{erfc}(x'/2\sqrt{D\tau}), \quad (1)$$

where erfc denotes the complementary error function. At the bottom of the source or drain, where x' equals x (the desired depth of the source or drain relative to the bottom of the material region), $C(x, \tau)$ is necessarily equal to $N_A$. Therefore, from Eq. (1), it follows that $$\text{erfc}(x/2\sqrt{D\tau}) = N_A/C_o'. \quad (2)$$

Because the right-hand side of Eq. (2) is a known quantity, it follows that the argument of the complementary error function in Eq. (2), i.e., $x/2\sqrt{D\tau}$, is known, e.g., is readily determined from, for example, tables of the erfc function. (See, e.g., Walter Gautschi, in *Handbook of Mathematical Functions*, Edited by M. Abramowitz and I. A. Segun (Dover, N.Y., 1968), pp. 295-318.) But x is known. In addition, D is essentially only a function of temperature and, because only a single temperature is employed during the heating procedure, D is also known, i.e., the value of D corresponding to the single temperature, T, is readily determined, for example, from tables. (See, e.g., J. C. C. Tsai, supra, at pp. 194-195.) Thus, because the value of the argument of the erfc function is known, and because the values of x and D are known, the value of $\tau$ (the heating time) is readily inferable. Consequently, in accordance with the iterative procedure, a substrate bearing an implanted control sample is heated to a temperature T for a time $\tau$, as determined above. If the resulting depth of the source or drain (relative to the bottom of the control sample) is other than desired (as determined, for example, via the SIMS technique), then the heating time and/or heating temperature is altered.

If it is desired to use a plurality of heating temperatures, $T_1, T_2, \ldots, T_n$, for a corresponding plurality of time intervals, $\tau_1, \tau_2, \ldots, \tau_n$, then it has been determined that C is well approximated by $$C(x',\tau_1,\tau_2,\cdots\tau_n) = C_o' \cdot \text{erfc}(x'/2\sqrt{D_1(T_1)\tau_1 + D_2(T_2)\tau_2 + \cdots D_n(T_n)\tau_n}), \quad (3)$$

where $D_1, D_2, \ldots, D_n$ denote the diffusion coefficients of the dopant in the substrate at temperatures $T_1, T_2, \ldots T_n$. Thus, at the bottom of the source or drain, i.e., at x'=x, where C is equal to $N_A$, it follows that $$\text{erfc}(x/2\sqrt{D_1\tau_1 + D_2\tau_2 + \cdots D_n\tau_n}) = N_A/C_o'. \quad (4)$$

As before, the right-hand side of Eq. (4) is known, and therefore the argument of the erfc function in Eq. (4) is readily determined. In addition, x is known and, assuming $T_1, T_2, \cdots, T_n$ are specified, $D_1, D_2, \cdots, D_n$ are thus also readily determined. Therefore, values of $\tau_1, \tau_2, \cdots, \tau_n$ are readily chosen which satisfy Eq. (4). As before, if these $\tau$ s do not yield the desired source/drain depth, then, in accordance with the iterative procedure, the $\tau$ s and/or the Ts are altered.

Using the above iterative technique, it has been found that heating a p-type silicon substrate having a doping level of $1 \times 10^{16} \text{cm}^{-3}$ and bearing the arsenic-implanted cobalt silicide region, described above, to a temperature of 800 degrees C. for 130 minutes, yields a source or drain having a depth (relative to the upper surface of the cobalt silicide) equal to 0.15 μm. Similarly, it has been found that heating an n-type silicon substrate having a doping level of $1 \times 10^{17} cm^{-3}$ and bearing the boron-implanted titanium silicide region, described above, to a temperature of 800 degrees C. for 124 minutes, yields a source or drain having a depth (relative to the upper surface of the titanium silicide) equal to 0.2 μm.

As a pedagogic aid to a more complete understanding of the invention, the application of the inventive device fabrication method to the fabrication of an n-channel MOS IC, as well as a CMOS (complementary metal-oxide-semiconductor) IC, is described below. (For the sake of brevity, some steps, which are entirely conventional, are omitted.)

With reference to FIGS. 1–8, an n-channel MOS IC is fabricated, in accordance with one embodiment of the invention, by forming a FOX 20 (i.e., a relatively thick layer 20 of $SiO_2$) on a p-type silicon substrate 10 using, for example, conventional oxidation techniques. The doping level of the p-type dopant in the substrate 10 is, for example, $1 \times 10^{15} cm^{-3}$. In addition, the thickness of the FOX 20 is, for example, 0.35 μm.

The FOX 20 is now selectively etched using, for example, conventional lithographic and reactive ion etching (RIE) techniques, to expose regions 30 of the substrate surface, here termed GASAD (gate-and-source-and-drain) regions, where MOSFETs are to be formed. A GOX 40 (i.e., a relatively thin layer 40 of $SiO_2$) having a thickness of, for example, 0.015 μm, is formed on the surface of the GASAD regions 30 using, for example, conventional oxidation techniques.

The gate electrodes of the MOSFETs are formed by initially depositing a layer 50 of polycrystalline silicon (hereafter polysilicon) onto the GASAD regions 30, as well as onto the FOX 20. The deposition is carried out using, for example, conventional low pressure chemical vapor deposition (LPCVD) techniques, and the thickness of the deposited polysilicon is, for example, 0.3 μm. After deposition, the polysilicon is made electrically conductive by implanting an n-type dopant, such as arsenic, into the polysilicon using an implant dose of, for example, $1 \times 10^{15} cm^{-2}$, and ion energies of, for example, 80 keV.

Figure 4:
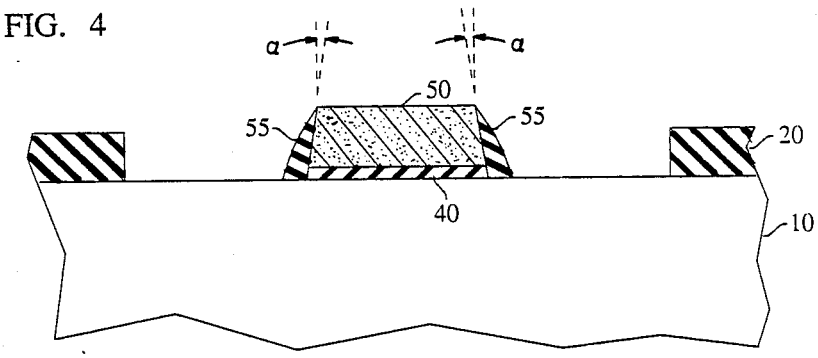
Figure 5:
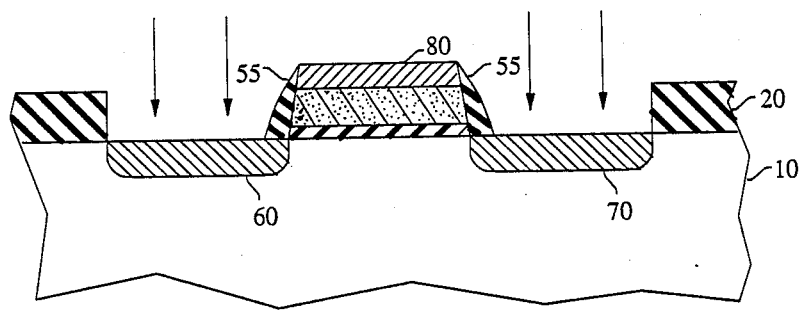
Figure 6:
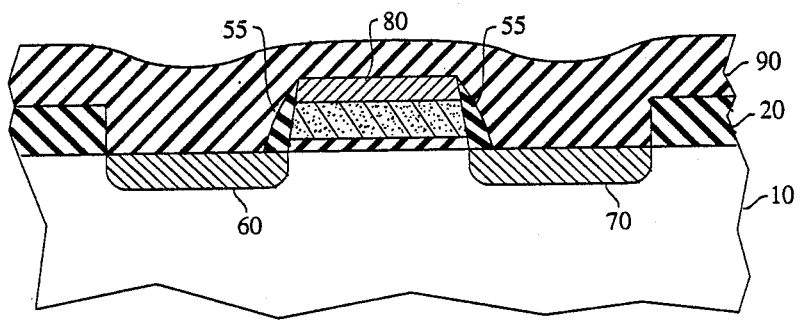
Figure 7:
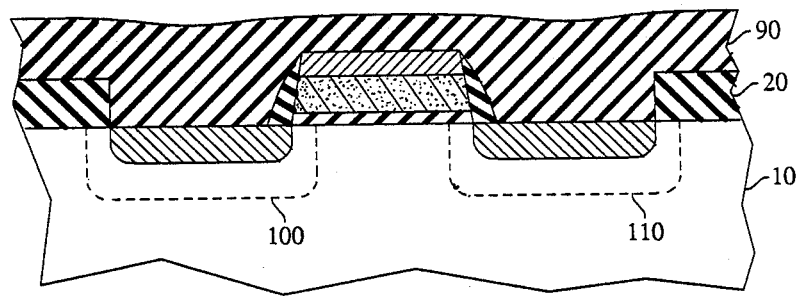
Figure 8:
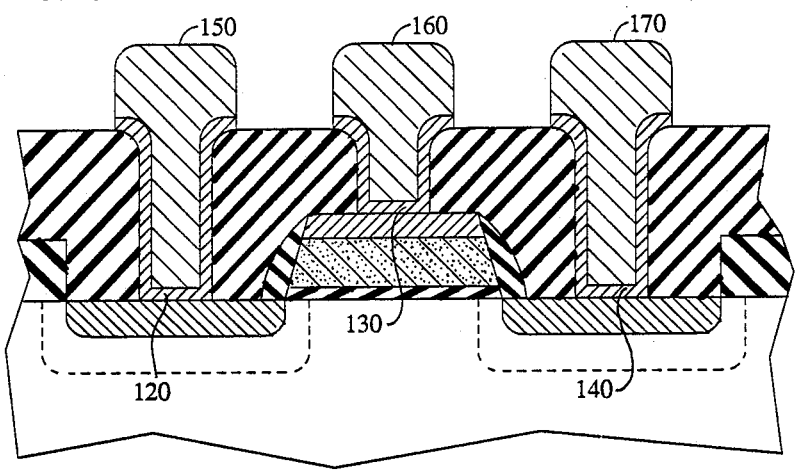
Figure 9:
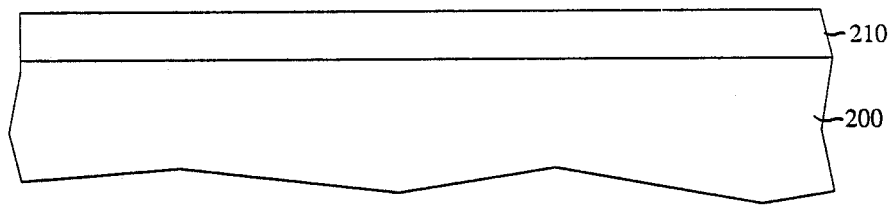
FIGS. 9-17 depict the steps involved in a second embodiment of the inventive device fabrication method.
Figure 10:
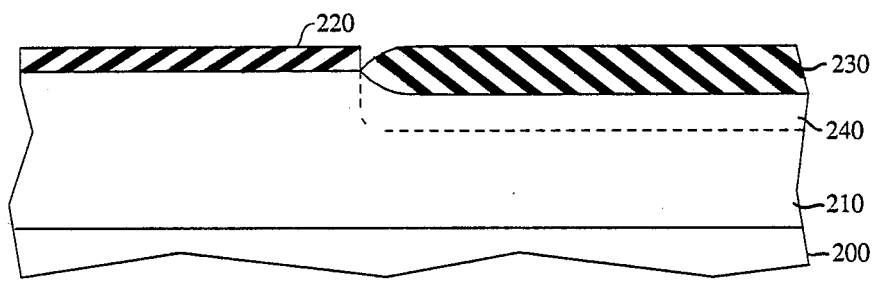
Figure 11:
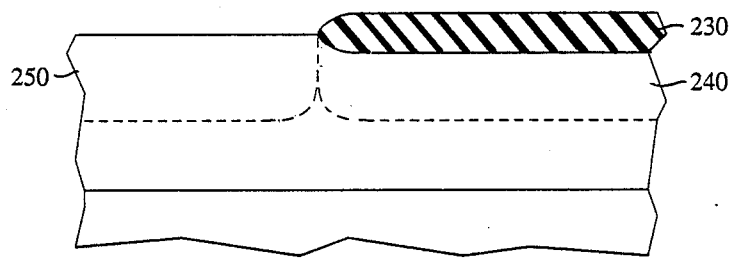
Figure 12:
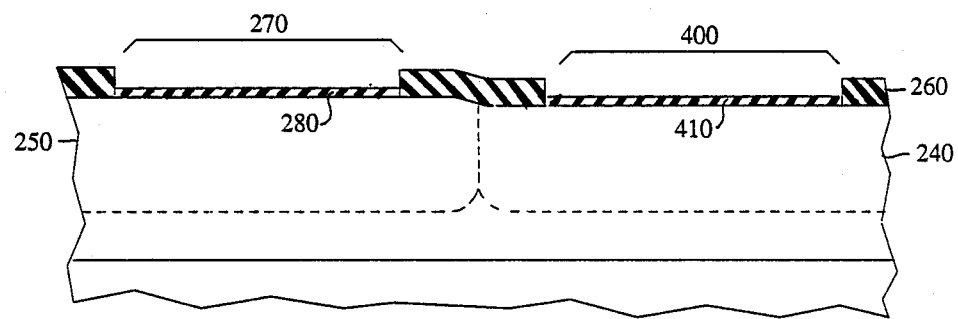
Figure 13:
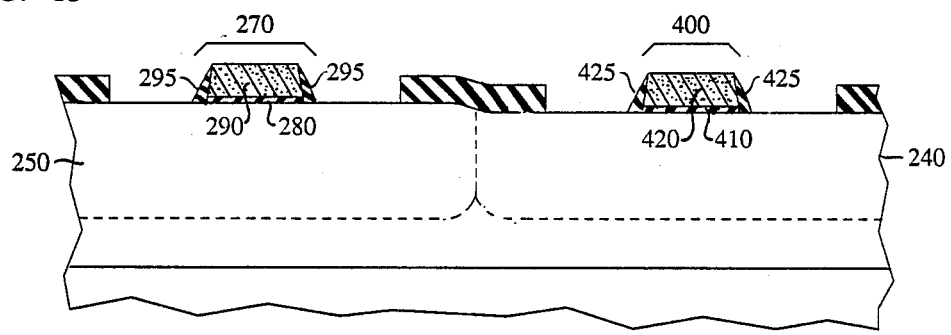
Figure 14:
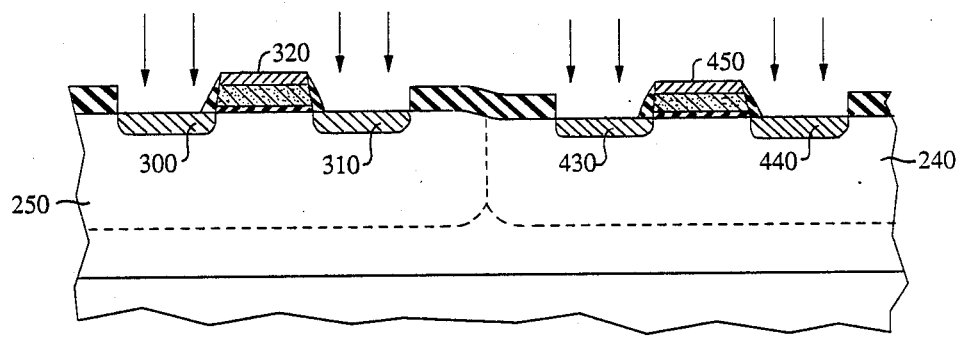
Figure 15:
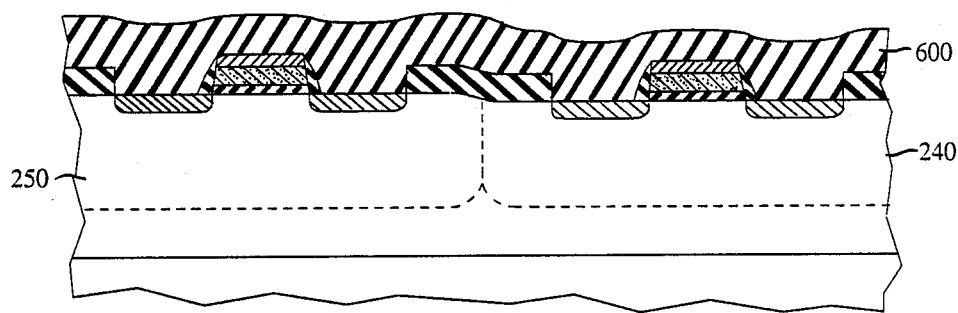
Figure 16:
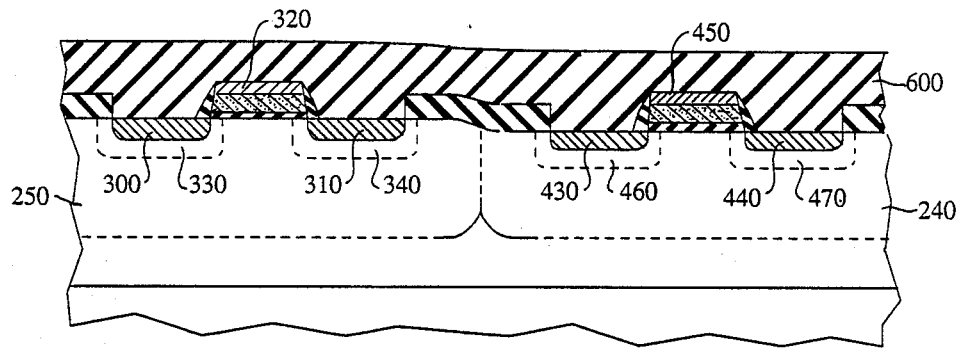
Figure 17:
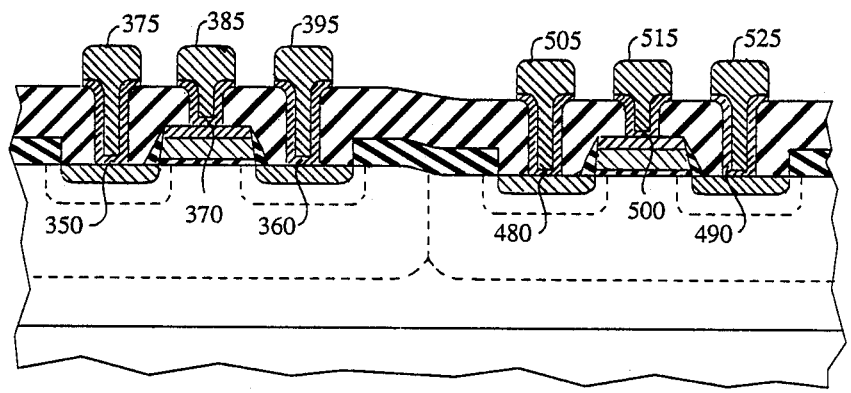

The deposited, electrically conductive polysilicon 50 (as well as the GOXs 40) are now patterned, using conventional RIE techniques, to form a polysilicon structure overlying each GASAD region 30, as depicted in FIG. 4. Significantly, each sidewall of this structure forms an angle, $\alpha$ (see FIG. 4), relative to a perpendicular to the surface of the corresponding GASAD region, which is equal to or less than +15 degrees, and preferably zero degrees. (For the left sidewall of the polysilicon structure depicted in FIG. 4, the angle $\alpha$ is positive when measured in the clockwise direction from the perpendicular. On the other hand, for the right sidewall, this angle is positive when measured in the counterclockwise direction.) This limitation on sidewall angle is important in relation to the formation of the silicon dioxide sidewall spacers 55, discussed below.

The device fabrication procedure, described here, results in a region of metal silicide being incorporated into the source, drain and gate electrode of each MOSFET. To preclude electrical contact between the metal silicide regions in the gate electrodes and the metal silicide regions in the sources and drains, the polysilicon portion of each gate electrode is formed to include a silicon dioxide sidewall spacer 55 (see FIG. 4) covering each polysilicon sidewall. This is achieved, for example, by depositing a layer of a silicon-and-oxygen containing material, such as tetraethyl orthosilicate (TEOS), onto the upper and sidewall surfaces of the polysilicon structures, as well as onto the exposed surfaces of the GASAD regions and the upper and sidewall surfaces of the FOX. The deposition of TEOS is readily carried out using, for example, conventional LPCVD techniques, and the thickness of the TEOS is, for example, 0.1 μm. After being deposited, the TEOS is preferably heated to, for example, 900 degrees C. for 20 minutes in a steam atmosphere in order to densify the TEOS and, in effect, convert it to a silicon dioxide-like material. The TEOS is then anisotropically etched, using, for example, RIE, in an etchant atmosphere of, for example, $CHF_3$ and $O_2$, in order to remove the TEOS from the FOX and GASAD surfaces, as well as from the upper surfaces of the polysilicon structures. Significantly, after this etching procedure, a layer of densified TEOS having a thickness of, for example, 0.06 μm remains on the sidewalls of the polysilicon structures provided the sidewall angles satisfy the requirement, discussed above.

After the formation of the sidewall spacers 55, a layer of metal capable of reacting with silicon to form a metal silicide, such as titanium, is deposited onto the upper surface of each polysilicon structure, onto the surfaces of the sidewall spacers 55, onto the exposed surfaces of the GASAD regions (where the sources and drains are to be formed) and onto the upper and sidewall surfaces of the FOX 20. The deposition is achieved using, for example, conventional sputtering techniques, and the thickness of the deposited titanium is, for example, 0.1 μm. After deposition, the titanium-covered silicon substrate is heated, in a nitrogen ($N_2$) atmosphere, to a temperature of about 600 degrees C. for about 1 minute using conventional RTA techniques. In those places where the titanium layer contacts silicon, i.e., on the upper surfaces of the polysilicon structures as well as on the surfaces of the GASAD regions, this heating procedure results in the formation of successive layers of TiN, Ti and $TiSi_y$, where $y \leq 2$. By contrast, in those places where the deposited titanium layer contacts silicon dioxide, i.e., the surfaces of the FOX and the sidewall spacers, the above heating procedure results in the formation of successive layers of TiN and Ti.

The layers of TiN and Ti, but not the $TiSi_y (y \leq 2)$, are etched away using a selective wet etchant, such as a solution of $H_2SO_4:H_2O_2(1:1)$ heated to a temperature of 90 degrees C. The remaining $TiSi_y (y \leq 2)$, covering the upper surfaces of the polysilicon structures and the exposed surfaces of the GASAD regions, is now further reacted with the underlying silicon (in the polysilicon structures and in the silicon substrate) by heating the $TiSi_y$-covered silicon substrate, in a nitrogen atmosphere, to, for example, 800 degrees C. for 20 seconds, using conventional RTA techniques. As a result, $TiSi_2$-containing regions 60 and 70 (see FIG. 5) are formed on opposite sides of and vertically aligned with, and a $TiSi_2$-containing region 80 is formed on top of, each polysilicon structure, with each such region having a thickness of $TiSi_2$ equal to about 0.08 μm. (Each such region typically also includes a layer of TiN (a good electrical conductor), having a thickness of about 0.01 μm and overlying the $TiSi_2$.)

To form $n^+$-type sources and drains, one or more n-type dopants, e.g., arsenic ions or phosphorus ions, are implanted into the $TiSi_2$-containing regions 60 and 70. The implant dose is, of course, chosen to satisfy the three conditions, discussed above. In addition, the ion energies are chosen so that essentially all the ions are implanted into the regions 60 and 70, and not into the underlying silicon.

After ion implantation, an interlevel dielectric 90 (see FIG. 6) is deposited onto the substrate. One such useful interlevel dielectric includes successive layers of un-doped TEOS and phosphorus-doped TEOS, with the former having a thickness of, for example, 0.2 μm and the latter having a thickness of, for example, 0.8 μm.

The upper surface of the deposited interlevel dielectric 90 is typically nonplanar (which is generally undersirable during subsequent processing). To induce the interlevel dielectric 90 to flow, and thus achieve surface planarity, as well as to diffuse the implanted dopants out of the TiSi$_2$-containing regions 60 and 70 and into the underlying silicon to form titanium silicide-covered sources and drains 100 and 110 (see FIG. 7), the substrate is heated. As discussed above, the temperature-time profile of the heating procedure is chosen to produce sources and drains having depths (as defined above) equal to or less than about 0.2 μm.

After the formation of the sources and drains, the interlevel dielectric is patterned (using conventional techniques) to open via holes to the sources, drains and gate electrodes. Layers of material 120, 130 and 140 (see FIG. 8) are now deposited onto the substrate and thus into the via holes extending, respectively, to the sources, drains, and gate electrodes, to serve as barriers to the (undesirable) interdiffusion of aluminum and silicon. These layers include, for example, a composite of 10 percent (by weight) titanium and 90 percent tungsten, and have thicknesses of, for example, 0.1 μm.

A layer of aluminum having a thickness of, for example, 1 μm is now deposited onto the interlevel dielectric 90, as well as onto the barrier layers 120, 130, and 140 in the via holes. Subsequent to deposition, the aluminum layer is patterned, using conventional techniques, to form interconnecting aluminum runners 150, 160 and 170 which terminate in metal contact pads.

The n-channel MOS IC is completed by a series of conventional steps which typically includes the deposition of a silicon nitride layer onto the IC to form a barrier against moisture and mechanical damage.

With reference to FIGS. 9-17, a CMOS IC is fabricated, in accordance with a second embodiment of the invention, by initially epitaxially growing a p-type silicon layer 210 (see FIG. 9) on a p$^+$-type silicon substrate 200, using conventional techniques. The doping level of the substrate 200 is, for example, $10^{19}$cm$^{-3}$ while the doping level of the epitaxially grown layer 210 is, for example, $10^{15}$cm$^{-3}$. In addition, the thickness of the epitaxially grown layer 210 is, for example, 5 μm.

Adjacent n- and p-tubs 240 and 250 are formed in the epitaxially grown layer 210 using the so-called twin-tub process described in U.S. Pat. No. 4,435,896 issued to L. C. Parrillo and R. S. Payne on Mar. 13, 1984, which is hereby incorporated by reference. That is, a layer 220 of silicon nitride (see FIG. 10), having a thickness of, for example, 0.1 μm, is initially deposited onto the upper surface of the layer 210, using conventional deposition techniques. Conventional lithographic and RIE techniques are used to remove a portion of the silicon nitride layer 220, thus exposing the silicon surface of what is to become the n-tub 240. Donor ions, e.g., phosphorus ions and arsenic ions, are implanted into the exposed silicon surface of the layer 210 (the remaining silicon nitride layer serving to shield the unexposed silicon of the layer 210 from the implant), the implant dose and energy for both phosphorus and arsenic ions being, for example, $2\times10^{12}$cm$^{-2}$ and 100 keV, respectively. The silicon substrate is then heated in a steam-containing atmosphere to a temperature and for a corresponding heating time of, for example, 950 degrees C. and 140 minutes, respectively, to form a layer 230 (see FIG. 10) of silicon dioxide having a thickness of about 0.4 μm, on the surface of the n-tub.

The layer 220 of silicon nitride is now etched away with a wet etchant, such as hot H$_3$PO$_4$, and acceptor ions, e.g., boron ions, are implanted into the now exposed silicon surface of what is to become the p-tub 250. (The silicon dioxide layer 230 shields the n-tub 240 from this implant.) If boron ions are used, then the implant dose and corresponding implant energy is, for example, $2\times10^{12}$cm$^{-2}$ and 50 keV, respectively. The silicon substrate is then heated in a nitrogen (N$_2$) atmosphere to a temperature and for a corresponding time period of, for example, 1150 degrees C. and 120 minutes, respectively, to diffuse both the boron and phosphorus ions into the layer 210 to a depth of about 2 μm, thus forming both the n-tub 240 and p-tub 250 (see FIG. 11).

The silicon dioxide layer 230 covering the n-tub 240 is etched away with a wet etchant, such as H$_2$O:HF(7:1). A relatively thick layer 260 of silicon dioxide (see FIG. 12), having a thickness of, for example, 0.4 μm, which serves as the FOX in the CMOS IC, is now formed on the (now fully exposed) upper surface of the epitaxially grown layer 210. This is achieved by heating the silicon substrate in a high pressure steam-containing atmosphere, e.g., a steam-containing atmosphere exhibiting a pressure of 25 atmospheres, to a temperature and a corresponding heating time of, for example, 850 degrees C. and 25 minutes, respectively.

The relatively thick layer 260 of silicon dioxide is patterned, using conventional techniques, to expose GASAD regions 270 (see FIG. 12) on the surface of the p-tub 250, where n-channel MOSFETs are to be formed, and to expose GASAD regions 400 on the surface of the n-tub 240, where p-channel MOSFETs are to be formed. The silicon substrate is then heated to a temperature and for a corresponding time period of, for example, 900 degrees C. and 27 minutes, respectively, to form layers 280 of silicon dioxide on the surfaces of the GASAD regions 270, and layers 410 of silicon dioxide on the surfaces of the GASAD regions 400, the layers 280 and 410 having thickness of about 0.0125 μm and serving as the GOXs of the n-channel and p-channel MOSFETs.

The gate electrodes of the n-channel and p-channel MOSFETs are formed by initially depositing a layer of polysilicon having a thickness of, for example, 0.3 μm onto the GASAD regions 270 and 400, as well as onto the FOX 260. A photoresist is deposited onto the substrate and patterned to expose the substrate surface corresponding to the n-tub 240. Acceptor ions, e.g., boron ions, are now implanted into the polysilicon overlying the n-tub, the resist shielding the polysilicon overlying the p-tub 250 from this implant. The implant dose and implant energy are, for example, $1\times10^{15}$cm$^{-2}$ and 30 keV, respectively. The resist is stripped, and a second resist is deposited onto the substrate and patterned to expose the substrate surface corresponding to the p-tub 250. Donor ions, e.g., arsenic ions, are implanted into the polysilicon overlying the p-tub 250, the second resist shielding the polysilicon overlying the n-tub 240 from this second implant. The implant dose and implant energy corresponding to the donor ions are, for example, $1\times10^{15}$cm$^{-2}$ and 30 keV, respectively. The second resist is stripped, and the substrate is heated in a nitrogen ($N_2$) atmosphere to a temperature and for a corresponding time period equal to, for example, 900 degrees C. and 30 minutes, respectively. As a consequence, the implanted dopants are diffused into the polysilicon, with the polysilicon overlying the n-tub 240 becoming of p-type conductivity, and the polysilicon overlying the n-tub 250 becoming of n-type conductivity.

The deposited and implanted polysilicon (as well as the underlying, relatively thin layers 280 and 410 of silicon dioxide) are now patterned, as described above, to form polysilicon structures 290 and 420 (see FIG. 13) overlying, respectively, the GASAD regions 270 and 400. As before, the sidewalls of these polysilicon structures must meet the requirement, discussed above. Silicon dioxide sidewall spacers 295 and 425 are formed on the polysilicon structures 290 and 420, respectively, as also described above.

A layer of metal capable of reacting with silicon to form a metal silicide, such as cobalt, is deposited onto the upper surfaces of the polysilicon structures 290 and 420, onto the surfaces of the sidewall spacers 295 and 425, onto the exposed surfaces of the GASAD regions (where the sources and drains are to be formed) and onto the upper and sidewall surfaces of the FOX 260. The thickness of the deposited cobalt is, for example, 0.02 $\mu$m. After deposition, the cobalt-covered substrate is heated in a reducing atmosphere, e.g., an atmosphere of $H_2$, to a temperature and for a corresponding time period of, for example, 450 degrees C. and ninety minutes, respectively. In those places where the cobalt contacts silicon, i.e., on the upper surfaces of the polysilicon structures as well as on the exposed surfaces of the GASAD regions, this heating procedure results in the formation of cobalt monosilicide (CoSi). In all other areas, the cobalt remains unreacted. The unreacted cobalt (but not the CoSi) is now stripped using a selective wet- etchant such as $H_3PO_4$:$CH_3COOH$:$HNO_3$:$H_2O$ (16:2:1:1). The substrate is then heated a second time, in an inert atmosphere, e.g., an argon (Ar) atmosphere, to a temperature and for a corresponding time period of, for example, 700 degrees C. and 30 minutes, respectively. This second heating induces the CoSi to further react with underlying silicon to form cobalt disilicide ($CoSi_2$) having a thickness of about 0.07 $\mu$m. Thus, $CoSi_2$-containing regions 300 and 310 (see FIG. 14) are formed on opposite sides of and vertically aligned with, and a $CoSi_2$-containing region 320 is formed on top of, each polysilicon structure 290. Similarly, $CoSi_2$-containing regions 430 and 440 are formed on opposite sides of and vertically aligned with, and a $CoSi_2$-containing region 450 is formed on top of, each polysilicon structure 420.

To form p+-type sources and drains for the p-channel MOSFETs in the n-tub 240, a photoresist, having a thickness of, for example, 1 $\mu$m, is deposited onto the substrate, and then patterned to expose the surface of the n-tub. Acceptor ions are now implanted into the $CoSi_2$-containing regions 430 and 440. (The resist serves to shield the p-tub 250 from this implant.) As before, the implant dose is chosen to satisfy the three conditions, discussed above, while the ion energies are chosen so that essentially all the ions are implanted into the regions 430 and 440. In this regard, if the acceptor ions are, for example, boron ions, then it has been determined that a useful implant dose is $8 \times 10^{15} cm^{-2}$, and that a useful, corresponding implant energy is 10 keV.

The deposited and patterned photoresist is stripped, and another photoresist, also having a thickness of about 1 $\mu$m, is deposited onto the substrate and patterned, but this time to expose the surface of the p-tub 250. Donor ions are now implanted into the $CoSi_2$-containing regions 300 and 310. (The newly-deposited resist serves to shield the n-tub 240 from this second implant.) Again, the implant dose and ion energies are chosen to satisfy the conditions and requirements discussed above. In this regard, if the donor ions are, for example, arsenic ions, then it has been determined that a useful implant dose is $5 \times 10^{15} cm^{-2}$, and a useful, corresponding implant energy is one which is equal to or less than 60 keV. On the other hand, if the donor ions are phosphorus ions, then a useful implant dose is $5 \times 10^{15} cm^{-2}$, and a useful, corresponding implant energy is one which is equal to or less than 30 keV.

After ion implantation, an interlevel dielectric 600 (see FIG. 15) including, for example, successive layers of 0.2 $\mu$m-thick undoped TEOS and 0.8 $\mu$m-thick phosphorus-doped TEOS, is deposited onto the substrate. As before, the interlevel dielectric 600 is induced to flow, and the implanted dopants are diffused out of the $CoSi_2$-containing regions and into the underlying silicon to form $CoSi_2$-covered n+-type sources and drains 330 and 340 (see FIG. 16) and $CoSi_2$-covered p+-type sources and drains 460 and 470, by heating the substrate. In this regard, to achieve sources and drains having depths equal to or less than about 0.2 $\mu$m, it has been determined that a useful heating procedure is to heat the substrate to a temperature of 800 degrees C. for 120 minutes.

It should be noted, in connection with the fabrication of the CMOS IC, that there is an additional requirement which must be satisfied when choosing the heating temperature or temperatures used to diffuse the implanted dopants out of the metal silicide regions and into the substrate. That is, when using, for example, conventional furnace heating, it has been found that at temperature in excess of about 900 degrees C., the n-type dopants in the n-type polysilicon structures 420 tend to diffuse into, and thus counterdope, the p-type polysilicon structures 290 (which are typically connected to the n-type polysilicon structures 420). Such counterdoping is undesirable because it leads to undesirable threshold voltage shifts in the p-channel MOSFETs. As a result, in accordance with the second embodiment of the invention, the heating temperatures employed when using furnace heating to fabricate the CMOS IC are less than 900 degrees C., and preferably equal to or less than about 850 degrees C.

After the formation of the sources and drains, the interlevel dielectric 600 is patterned to open via holes to the sources, drains and gate electrodes. Barriers to the interdiffusion of aluminum and silicon, i.e., layers 350, 360, and 370 (see FIG. 17), and 480, 490, and 500, are deposited into the via holes. Interconnecting aluminum runners 375, 385, 395, and 505, 515, and 525 (see FIG. 17), extending form the sources, drains, and gate electrodes to metal contact pads, are formed, as described above.

The CMOS IC is completed by a series of conventional steps which includes the deposition of a silicon nitride layer onto the IC to form a barrier against moisture and mechanical damage.

What is claimed is:
1. A device, comprising:

a substrate which includes a surface, semiconductor material, and a substrate region having a conductivity which is opposite to that of the surrounding semiconductor material, said substrate region extending from said surface into said substrate and having a lateral extent less than that of said surface; and a material region, having a composition which includes cobalt and silicon, contacting said surface and overlying said substrate region, CHARACTERIZED IN THAT a depth of said substrate region, as measured from the top of said material region, is equal to or less than about 0.2 μm, and a specific contact resistance of said material region to said substrate is equal to or less than about $10^{-6}\Omega\text{-cm}^2$.

2. The device of claim 1, wherein said device includes a MOSFET, and said material region and said substrate region constitute a source or drain of said MOSFET.

3. The device of claim 1, wherein said device includes a MESFET, and said material region and said substrate region constitute a source or drain of said MESFET.

4. The device of claim 1, wherein said composition includes cobalt silicide.

5. The device of claim 1, wherein said semiconductor material includes silicon.

* * * * *